US009843291B2

United States Patent
Chang et al.

(10) Patent No.: US 9,843,291 B2
(45) Date of Patent: Dec. 12, 2017

(54) CASCADED SWITCH BETWEEN PLURALITIES OF LNAS

(71) Applicant: QUALCOMM Incorporated, San Diego, CA (US)

(72) Inventors: Li-Chung Chang, Irvine, CA (US); Liang Dai, San Diego, CA (US); Prasad Srinivasa Siva Gudem, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/821,614

(22) Filed: Aug. 7, 2015

(65) Prior Publication Data

US 2017/0040947 A1    Feb. 9, 2017

(51) Int. Cl.
| H03F 1/02 | (2006.01) |
| H04B 1/00 | (2006.01) |
| H03F 3/19 | (2006.01) |
| H03F 3/21 | (2006.01) |

(52) U.S. Cl.
CPC ............. *H03F 1/0205* (2013.01); *H03F 3/19* (2013.01); *H03F 3/211* (2013.01); *H04B 1/006* (2013.01); *H03F 2200/294* (2013.01); *H03F 2200/451* (2013.01); *H03F 2203/21109* (2013.01)

(58) Field of Classification Search
CPC ................................. H03F 1/0288; H03F 1/07
USPC ......................... 330/51, 124 R, 295
See application file for complete search history.

(56) References Cited

U.S. PATENT DOCUMENTS

| 5,287,543 | A | * | 2/1994 | Wolkstein | H04B 7/2045 330/124 R |
| 6,064,258 | A | * | 5/2000 | Shulman | H03F 1/0277 330/253 |
| 7,301,395 | B2 | * | 11/2007 | Mobbs | H03F 1/0288 330/124 R |
| 7,863,977 | B1 | * | 1/2011 | Xiang | A61B 5/0428 330/124 R |
| 7,973,596 | B2 | * | 7/2011 | Eschauzier | H03F 3/347 330/51 |
| 8,044,540 | B2 | | 10/2011 | Lee et al. | |
| 8,120,422 | B1 | * | 2/2012 | Huijsing | H03F 1/083 327/124 |
| 8,300,681 | B2 | | 10/2012 | Petrovic et al. | |
| 8,320,864 | B2 | * | 11/2012 | Fanous | H03F 3/45183 330/124 R |
| 8,412,125 | B2 | | 4/2013 | Smith | |
| 8,620,252 | B2 | | 12/2013 | Rodal | |
| 8,737,931 | B2 | * | 5/2014 | Lin | H04B 7/0817 455/101 |
| 9,431,963 | B2 | | 8/2016 | Wang et al. | |
| 2013/0234792 | A1 | * | 9/2013 | Niitsu | H03F 3/602 330/124 R |
| 2013/0295866 | A1 | | 11/2013 | Zuo et al. | |

(Continued)

OTHER PUBLICATIONS

International Search Report and Written Opinion—PCT/US2016/040826—ISA/EPO—dated Sep. 28, 2016, 10 pages.

*Primary Examiner* — Henry Choe
(74) *Attorney, Agent, or Firm* — Qualcomm Incorporated—Toler (57) ABSTRACT

An apparatus includes a first plurality of low noise amplifiers (LNAs) and a cascaded switch configured to route outputs of the first plurality of LNAs to a second plurality of LNAs.

15 Claims, 8 Drawing Sheets

(56) References Cited

U.S. PATENT DOCUMENTS

2014/0043206 A1 2/2014 Ahn et al.
2015/0349722 A1* 12/2015 Wang .................. H03F 1/26
　　　　　　　　　　　　　　　　　　　　330/295

* cited by examiner

CASCADED SWITCH BETWEEN PLURALITIES OF LNAS

I. FIELD

The present disclosure is generally related to electronics, and more specifically to transceivers.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities and may support increasing wireless communication capability, particularly in downlink communications that provide information to the wireless telephones.

As downlink data rates increase, an increasing number of carrier combinations have been introduced for carrier aggregation (CA) applications. Intra-CA operation that involves processing multiple non-contiguous carrier signals from a single radio-frequency (RF) input port presents challenges to CA receive (Rx) architectures to achieve low noise figure (NF) and high linearity with limited power consumption and area usage. Conventionally, a "split" low noise amplifier (LNA) architecture may be used to facilitate intra-CA with non-contiguous carriers ("intra non-contiguous CA"). However, such split LNA architectures complicate Rx signal routing and degrade Rx performance. As the number of possible carrier combinations increases, signal routing in split LNA architectures and receiver blocks to support the carrier combinations becomes increasingly complex. The complexity of signal routing circuitry impacts performance, power consumption, and chip area/size (e.g., a key performance indicator).

IV. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
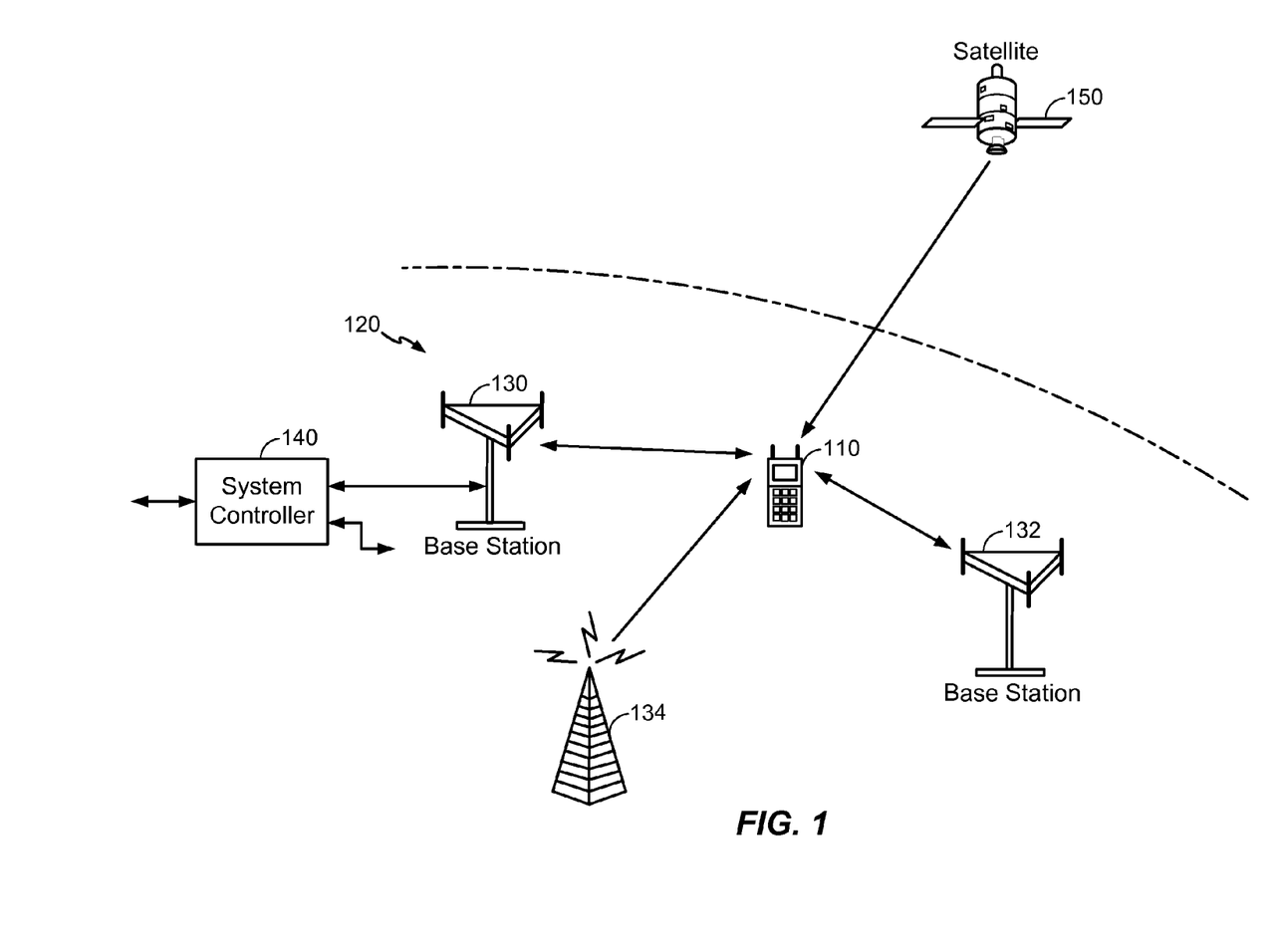
FIG. 1 shows a wireless device communicating with a wireless system and that includes a cascaded switch.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc. In an exemplary embodiment, the wireless device 110 may include an integrator.

Furthermore, in an exemplary embodiment, the wireless device 110 may include a cascaded switching matrix module having a cascaded switch that is configured to route outputs of a first plurality of low noise amplifiers (LNAs) to a second plurality of LNAs. The cascaded switching matrix module may provide flexible routing between LNAs that amplify received radio-frequency (RF) signals and LNAs in receiver circuits that process the amplified RF signals. Parasitic loading at the output of the LNAs of the first set of LNAs and overall system complexity may be reduced as compared to conventional RF receiver architectures as a result of the cascaded switching matrix module, as explained in further detail with respect to FIGS. 2-7.

Figure 2:
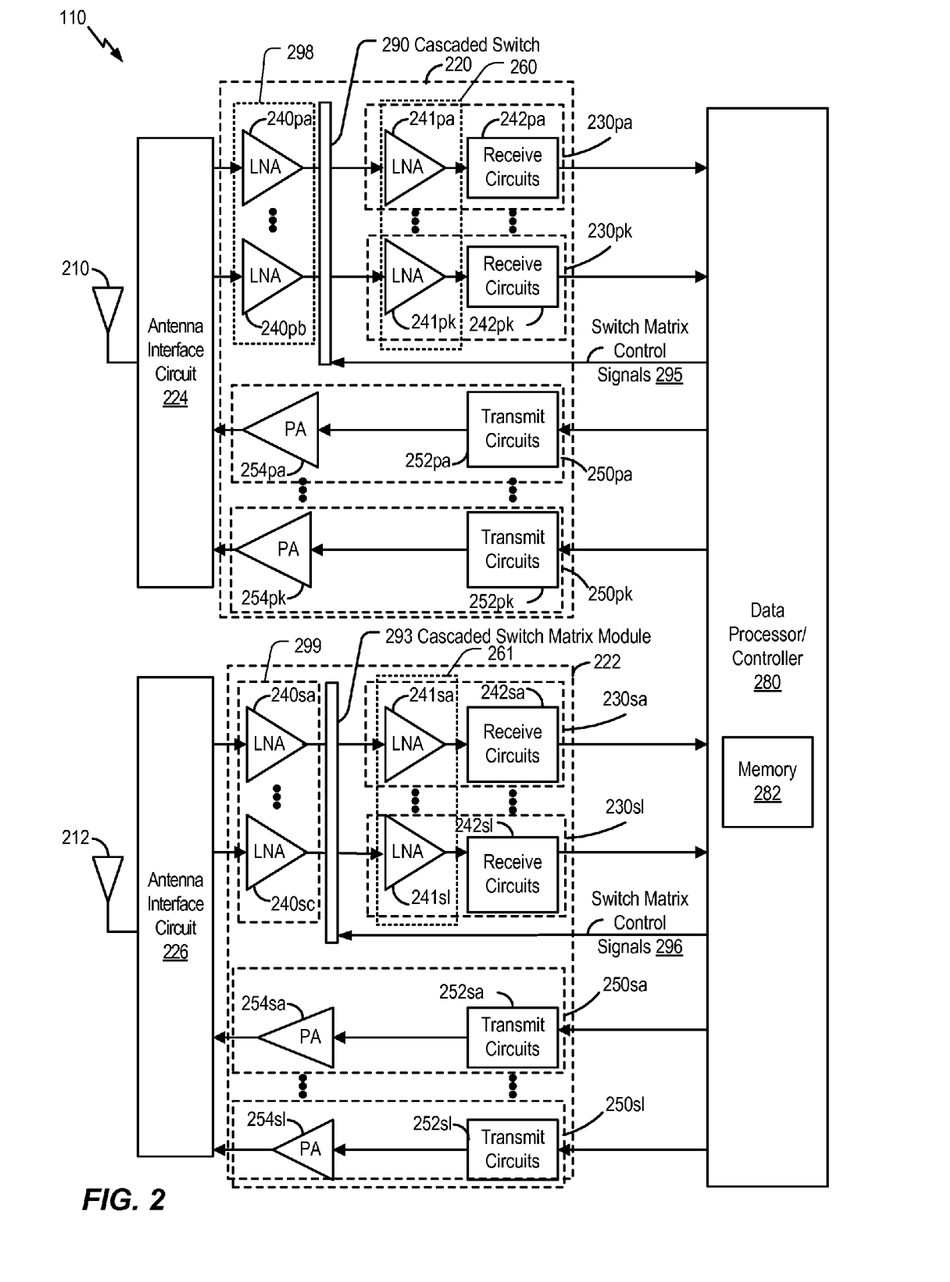
FIG. 2 shows a block diagram of the wireless device in FIG. 1 that includes the cascaded switch.

FIG. 2 shows a block diagram of an exemplary design of wireless device 110 in FIG. 1. In this exemplary design, wireless device 110 includes a transceiver 220 coupled to a primary antenna 210 via an antenna interface circuit 224, a transceiver 222 coupled to a secondary antenna 212 via an antenna interface circuit 226, and a data processor/controller 280. Transceiver 220 includes multiple (K) receivers 230pa to 230pk and multiple (K) transmitters 250pa to 250pk to support multiple frequency bands, multiple radio technologies, carrier aggregation, etc. Transceiver 222 includes multiple (L) receivers 230sa to 230s1 and multiple (L) transmitters 250sa to 250s1 to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, transceiver 220 includes a first plurality of LNAs 298 that includes LNAs 240pa to 240pb coupled to a cascaded switch 290, such as described in further detail with reference to FIGS. 3-7. Outputs of the cascaded switch 290 are coupled to a second plurality of LNAs 260 that includes LNAs 241pa to 241pk. The LNAs 241pa to 241pk of the second plurality of LNAs 260 are included in receivers 230pa to 230pk. A first number of LNAs in the first plurality of LNAs 298 (B) may be greater than a second number of LNAs in the second plurality of LNAs 260 (K), as described in further detail with respect to FIGS. 3-4. Transceiver 222 includes a third plurality of LNAs 299 that includes LNAs 240sa to 240sc coupled to a cascaded switch 293. Outputs of the cascaded switch 293 are coupled to a fourth plurality of LNAs 261 that includes LNAs 241sa to 241s1. The LNAs 241sa to 241s1 of the fourth plurality of LNAs 261 are included in receivers 230sa to 230s1. A number of LNAs in the third plurality of LNAs 299 (C) may be greater than a number of LNAs in the fourth plurality of LNAs 261 (L).

In the exemplary design shown in FIG. 2, each receiver 230 includes one of the LNAs 241pa to 241pk or one of the LNAs 241sa to 241s1 and one of the receive circuits 242pa to 242pk or one of the receive circuits 242sa to 242s1. For data reception, antenna 210 receives signals from base stations and/or other transmitter stations and provides a received RF signal, which is routed through the antenna interface circuit 224 and presented as an input RF signal to the first plurality of LNAs 298. The cascaded switch 290 routes an amplified version of the RF signal to a selected receiver, such as via a first input signal path to receiver 230pa or via a second input signal path to receiver 230pk. Similarly, antenna 212 receives signals from base stations and/or other transmitter stations and provides a received RF signal, which is routed through the antenna interface circuit 226 and presented as an input RF signal to the third plurality of LNAs 299. The cascaded switch 293 routes an amplified version of the RF signal to a selected receiver, such as via a first input signal path to receiver 230sa or via a second input signal path to receiver 230s1. Antenna interface circuit 224 and antenna interface circuit 226 may each include switches, duplexers, transmit filters, receive filters, matching circuits, etc.

The description below assumes that receiver 230pa is a selected receiver. One or more of the LNAs 240pa to 240pb amplifies the input RF signal and provides an output RF signal to the cascaded switch 290. The cascaded switch 290 routes an output RF signal to the receiver 230pa where the RF signal is again amplified by the LNA 241pa. Receive circuits 242pa downconvert the output RF signal output by the LNA 241pa from RF to baseband, amplify and filter the downconverted signal, and provide an analog input signal to data processor/controller 280. Receive circuits 242pa may include mixers, filters, amplifiers, matching circuits, an oscillator, a local oscillator (LO) generator, a phase locked loop (PLL), etc. Each of the receivers 230pa to 230pk in transceiver 220 and each of the receivers 230sa to 230s1 in transceiver 222 may operate in a similar manner as receiver 230pa.

In the exemplary design shown in FIG. 2, each of the transmitters 250pa to 250pk and 250sa to 250s1 includes one of the transmit circuits 252pa to 252pk or 252sa to 252s1 and one of the power amplifiers (PAs) 254pa to 254pk or 254sa to 254s1. For data transmission, data processor/controller 280 processes (e.g., encodes and modulates) data to be transmitted and provides an analog output signal to a selected transmitter. The description below assumes that transmitter 250pa is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via antenna 210. Each of the transmitters 250pa to 250pk and 250sa to 250s1 may operate in a similar manner as transmitter 250pa.

FIG. 2 shows an exemplary design of receivers 230pa to 230pk and 230sa to 230s1 and transmitters 250pa to 250pk and 250sa to 250s1. A receiver and a transmitter may also include other circuits not shown in FIG. 2, such as filters, matching circuits, etc. All or a portion of transceiver 220 and/or transceiver 222 may be implemented on one or more analog integrated circuits (ICs), RF ICs (RFICs), mixed-signal ICs, etc. For example, LNAs 240 and receive circuits 242 may be implemented on one module, which may be an RFIC, etc. The circuits in transceivers 220 and 222 may also be implemented in other manners.

Data processor/controller 280 may perform various functions for wireless device 110. For example, data processor/controller 280 may perform processing for data being received via receivers 230 and data being transmitted via transmitters 250, such as one or more switch matrix control signals 295 that control a configuration of the cascaded switch 290 and/or one or more switch matrix control signals 296 that control a configuration of the cascaded switch 293. Data processor/controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Wireless device 110 may support multiple band groups, multiple radio technologies, and/or multiple antennas. Wireless device 110 may include a number of LNAs to support reception via the multiple band groups, multiple radio technologies, and/or multiple antennas. Exemplary embodiments of components that may be included in the transceivers 220 and 222 are illustrated and described with respect to FIGS. 3-7.

Figure 3:
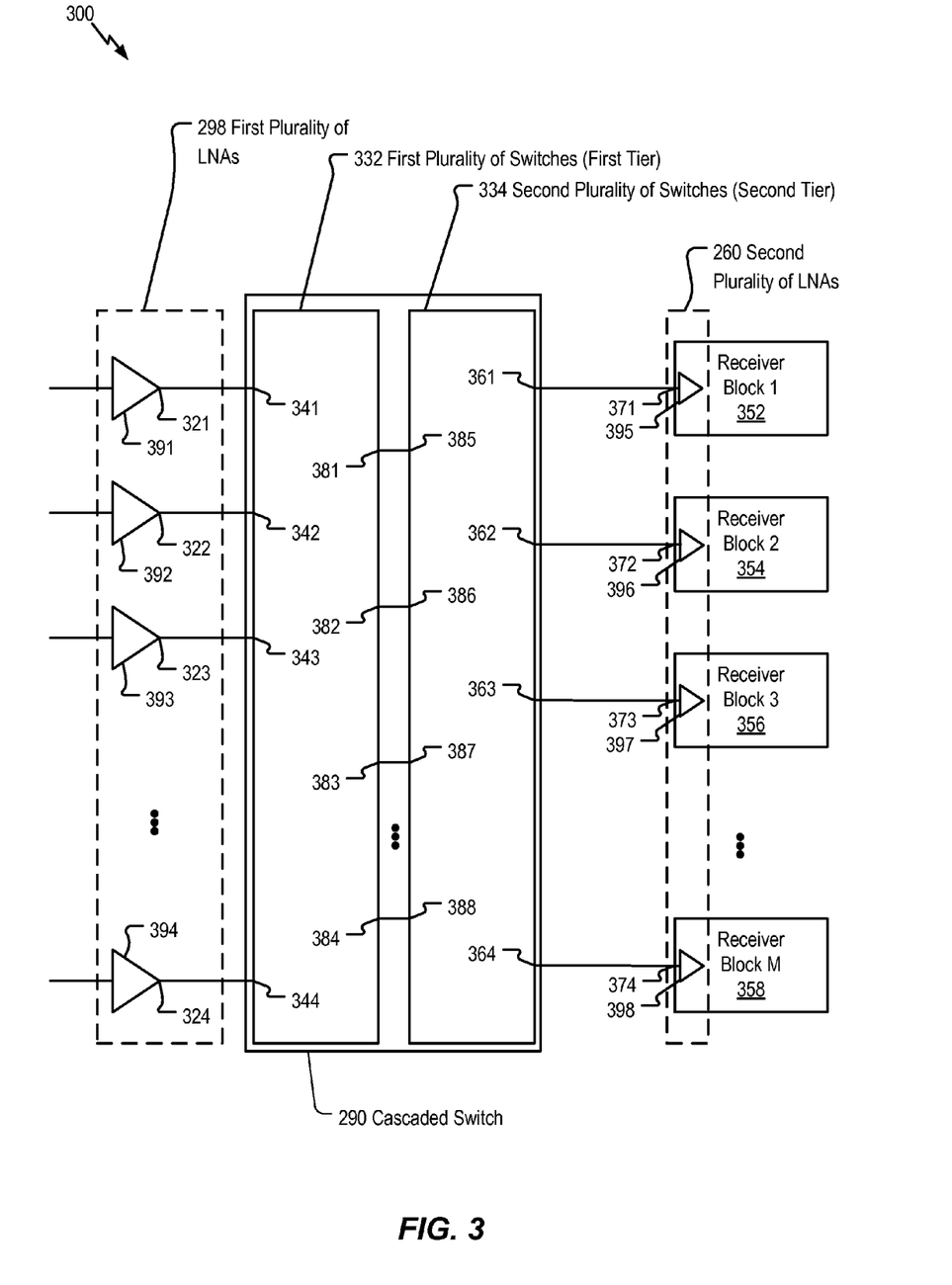
FIG. 3 shows a block diagram of an exemplary embodiment of components including a cascaded switch that may be included in the wireless device of FIG. 1.

FIG. 3 illustrates an exemplary embodiment 300 of components that may be included in the wireless device 110 including the first plurality of LNAs 298, the cascaded switch 290, and the second plurality of LNAs 260. The cascaded switch 290 is configured to provide a "single input and single output" topology by providing a one-to-one connection between selected inputs of the cascaded switch 290 and outputs of the cascaded switch 290. The cascaded switch 290 includes a first plurality of switches 332 in a first tier of the cascaded switch 290 and a second plurality of switches 334 in a second tier of the cascaded switch 290. The cascaded switch 290 may be configured to couple a plurality of outputs of the LNAs of the first plurality of LNAs 298 to a plurality of the LNAs of the second plurality of LNAs 260. The LNAs of the second plurality of LNAs 260 are illustrated in receiver blocks of a transceiver, such as the transceiver 220 of FIG. 2. Although FIG. 3 depicts an example of components that may be included in the transceiver 220 of FIG. 2, similar components may also be included in the transceiver 222 of FIG. 2.

Figure 6:
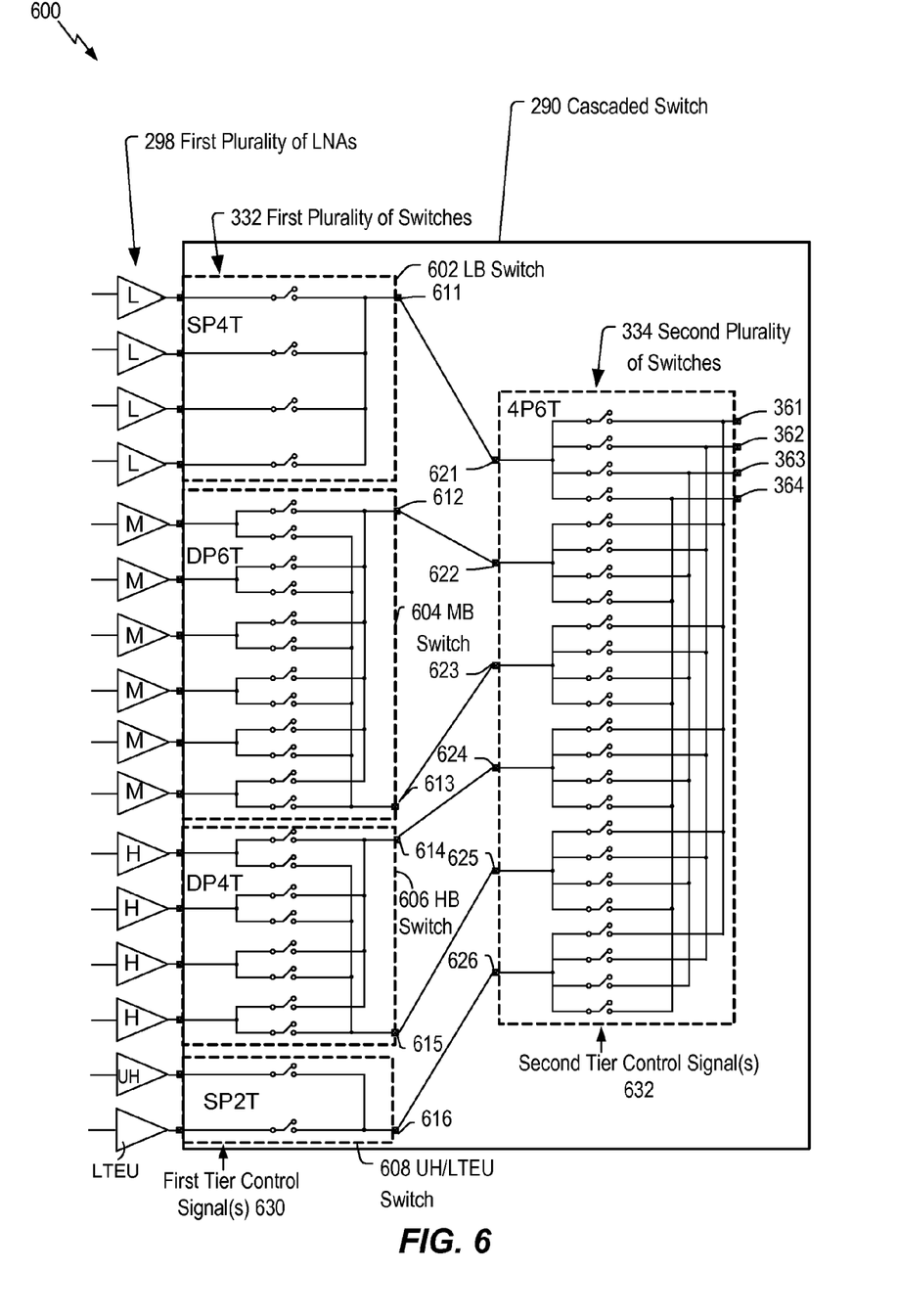
FIG. 6 shows a diagram of an exemplary embodiment of components of the cascaded switch of FIG. 3.

The first plurality of LNAs 298 includes a first LNA 391, a second LNA 392, a third LNA 393, and a Kth LNA 394. For example, the first LNA 391 may correspond to the LNA 240pa and the Kth LNA 394 may correspond to the LNA 240pb of FIG. 2. Although four LNAs (e.g., K=4) are illustrated, the first plurality of LNAs 298 may include two LNAs, three LNAs, or more than four LNAs (e.g., K is an integer greater than 1). In some implementations, each LNA of the first plurality of LNAs 298 may be responsive to a relatively narrow frequency band that corresponds to a particular downlink carrier of a set of carriers that are supported by the wireless device 110. An illustrative example with K=16 is depicted in FIG. 6.

The first plurality of switches 332 includes first switches having inputs coupled to the first plurality of LNAs 298. For example, a first input 341 is coupled to an output 321 of the first LNA 391, a second input 342 is coupled to an output 322 of the second LNA 392, a third input 343 is coupled to an output 323 of the third LNA 393, and a Kth input 344 is coupled to an output 324 of the Kth LNA 394.

The first plurality of switches 332 has a first output 381, a second output 382, a third output 383, and an Nth output 384. The outputs 381-384 are selectively coupled to the inputs 341-344 so that each input signal that is received via one or more selected inputs 341-344 is routed to a selected output 381-384. Although four outputs of the first plurality of switches 332 are illustrated (e.g., N=4), the first plurality of switches 332 may include two outputs, three outputs, or more than four outputs (e.g., N is an integer greater than 1). An illustrative example of switching elements in the first plurality of switches 332 with K=16 and N=6 is depicted in FIG. 6.

The second plurality of switches 334 includes second switches having inputs coupled to selected outputs 381-384 of the first plurality of switches 332. For example, a first input 385 may be coupled to the first output 381, a second input 386 may be coupled to the second output 382, a third input 387 may be coupled to the third output 383, and an Nth input 388 may be coupled to the Nth output 384 (e.g., each of the "N" outputs 381-384 of the first plurality of switches 332 is coupled to a corresponding input of the "N" inputs 385-388 of the second plurality of switches 334). The second plurality of switches 334 has a first output 361, a second output 362, a third output 363, and an Mth output 364. The outputs 361-364 of the second plurality of switches 334 are selectively coupled to the inputs 385-388 of the second plurality of switches 334 so that each input signal that is received via one or more selected inputs 385-388 is routed to a selected output 361-364. Although four outputs of the second plurality of switches 334 are illustrated (e.g., M=4), in other implementations the second plurality of switches 334 may have any number of outputs (e.g., M is any positive integer). An illustrative example of switching elements in the second plurality of switches 334 with N=6 and M=4 is depicted in FIG. 6.

Each output 361-364 of the second plurality of switches 334 may be coupled to an input of a corresponding receiver block. For example, the first output 361 may be coupled to a first LNA 395 of the second plurality of LNAs 260 via an input 371 of a first receiver block 352. The second output 362 may be coupled to a second LNA 396 of the second plurality of LNAs 260 via an input 372 of a second receiver block 354. The third output 363 may be coupled to a third LNA 397 of the second plurality of LNAs 260 via an input 373 of a third receiver block 356. The Mth output 364 (illustrated as M=4) may be coupled to an Mth LNA 398 of the second plurality of LNAs 260 via an input 374 of an Mth receiver block 358. For example, the first LNA 395 may correspond to LNA 241pa of FIG. 2 and the Mth LNA 398 may correspond to LNA 241pk of FIG. 2. The cascaded switch 290 may be configured to couple the plurality of outputs 321-324 to LNAs of the second plurality of LNAs 260 based on bandwidth and via printed circuit board routing, such as described in further detail with respect to FIG. 6 and FIG. 7.

Figure 4:
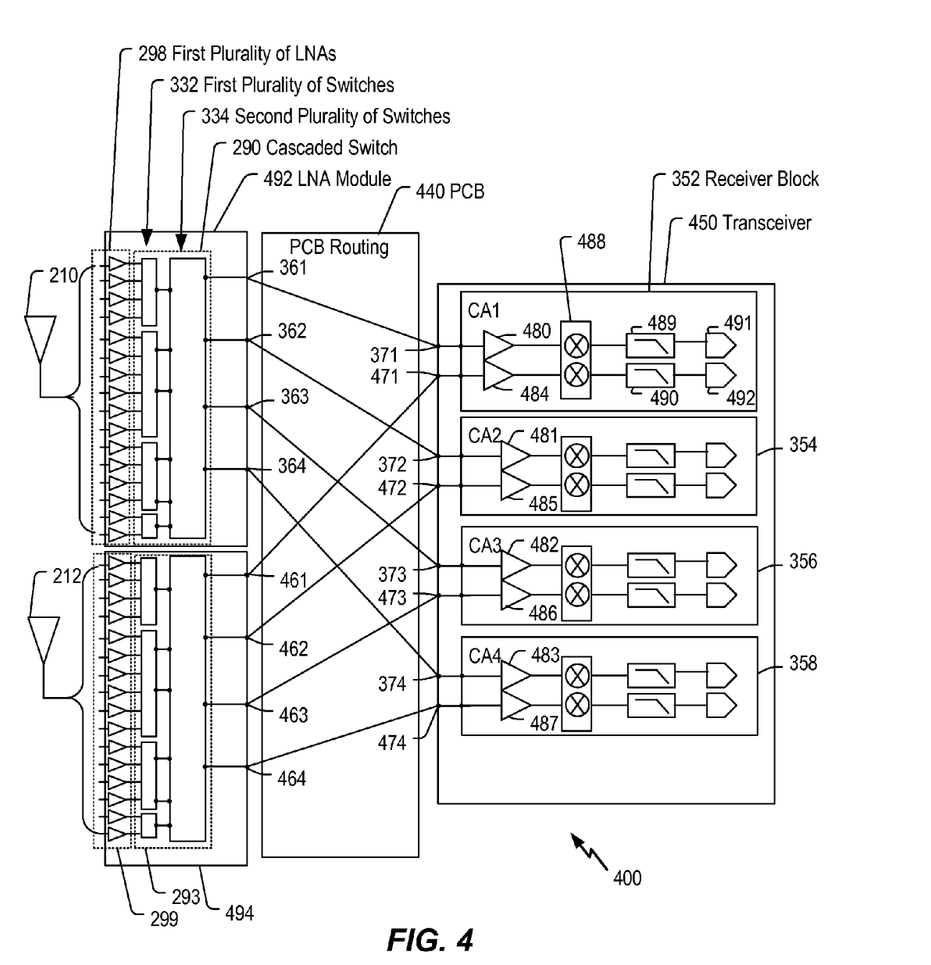
FIG. 4 shows a block diagram of another exemplary embodiment of components including a cascaded switch that may be included in the wireless device of FIG. 1.
Figure 5:
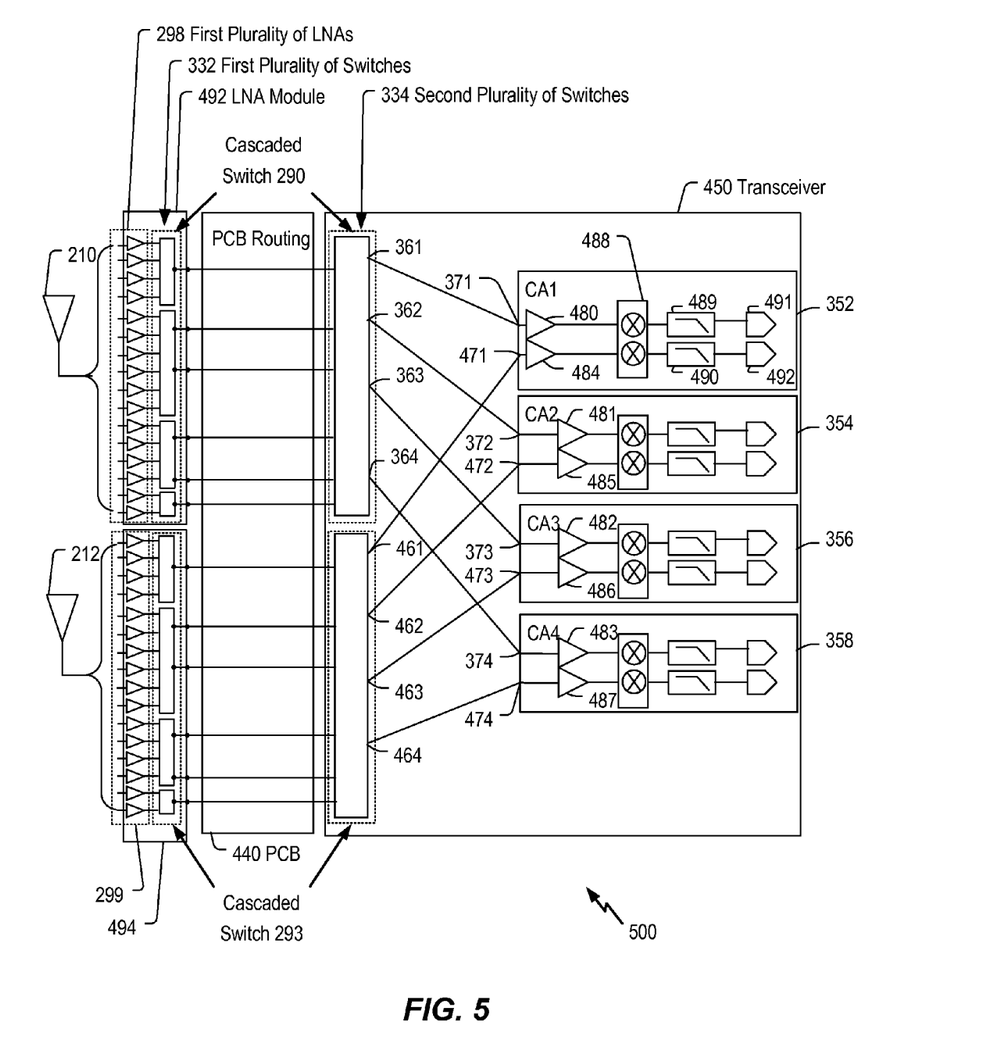
FIG. 5 shows a block diagram of another exemplary embodiment of components including a cascaded switch that may be included in the wireless device of FIG. 1.

FIG. 3 therefore illustrates a cascaded switch 290 that includes the first plurality of switches 332 configured to receive a signal from a set of LNAs (e.g., the first plurality of LNAs 298) and includes the second plurality of switches 334 configured to send the signal to a second set of LNAs (e.g., the second plurality of LNAs 260). In some implementations, the cascaded switch 290, the first plurality of LNAs 298, and the second plurality of LNAs 260 may be on a single chip. In other implementations, the cascaded switch 290 and the first plurality of LNAs 298 may be on a single chip and the second plurality of LNAs 260 may be on another chip, such as illustrated in FIG. 4. Alternatively, the cascaded switch 290 and the second plurality of LNAs 260 may be on a single chip and the first plurality of LNAs 298 may be on another chip. As another alternative, the first plurality of LNAs 298 may be on a first chip, the cascaded switch 290 may be on a second chip, and the second plurality of LNAs 260 may be on a third chip. Other configurations may be used. For example, the cascaded switch 290 may include the first plurality of switches 332 on one chip and the second plurality of switches 334 on another chip, such as illustrated in FIG. 5.

The LNAs in the first plurality of LNAs 298 may have a narrow band architecture to interface with a front-end duplexer (e.g., in the antenna interface circuit 224 or 226 of FIG. 2). The cascaded switch 290 provides a "single input and single output" topology (e.g., a one-to-one connection between selected inputs of the cascaded switch 290 and outputs of the cascaded switch 290) that may improve overall receiver sensitivity and overall noise figure. The cascaded switch 290 enables connection between a larger number of LNAs to a smaller number of LNAs in receiver blocks via operation of switching elements of the first plurality of switches 332 and the second plurality of switches 334. Because the cascaded switch 290 provides a separate input for each LNA of the first plurality of LNAs 298, LNA output parasitic loading may be reduced as compared to transceiver architectures that couple multiple LNA outputs together.

FIG. 4 illustrates another exemplary embodiment 400 of components that may be included in the wireless device 110 of FIG. 1, including an exemplary embodiment of the cascaded switch 290 and the cascaded switch 293 of FIG. 2. A first LNA module 492 includes the first plurality of LNAs 298 and is configured to couple the first plurality of LNAs 298 to the antenna 210, such as a primary antenna. A second LNA module 494 includes the third plurality of LNAs 299 and may couple the third plurality of LNAs 299 to the antenna 212, such as a diversity antenna.

The cascaded switch 290 is configured to couple outputs of the first plurality of LNAs 298 to the second plurality of LNAs 260 (e.g., LNAs 480-483) in receiver blocks 352, 354, 356, and/or 358 of a transceiver 450 via routing over a printed circuit board (PCB) 440. The cascaded switch 290 may serve as a bridge between narrow band LNAs of the first plurality of LNAs 298 and wide band LNAs of the second plurality of LNAs 260. For example, the outputs 361-364 of the second plurality of switches 334 are coupled via PCB routing to the inputs 371-374 of the receiver blocks 352-358, respectively. Each of the receiver blocks 352-358 may correspond to a CA "pipe" and may be configurable to support any designated CA (e.g., the LNAs in the second plurality of LNAs 260 in the receiver blocks 352-358 may be wide band LNAs that can support a full input spectrum, such as 600 megahertz (MHz)-6 gigahertz (GHz)).

Each of the receiver blocks 352-358 of the transceiver 450 includes a pair of LNAs coupled to an RF processing chain that includes mixers, filters, and analog-to-digital converters (ADCs). For example, the first receiver block 352 includes a first LNA 480 that is part of the second plurality of LNAs 260 and is coupled to the output 361 of the first cascaded switch 290 and a second LNA 484 that is part of the fourth plurality of LNAs 261 and is coupled to an output 461 of the second cascaded switch 293. A mixer circuit 488 may include one or more first mixers configured to down-convert an output of the first LNA 480 to baseband and one or more second mixers configured to down-convert an output of the second LNA 484 to baseband. Filters 489, 490 are coupled to outputs of the mixer circuit 488 and are configured to provide filtered baseband signals to a first ADC 491 and to a second ADC 492, respectively. Providing parallel processing paths for a first signal from the first plurality of LNAs 298 (e.g., a primary signal path) and a second signal from the third plurality of LNAs 299 (e.g., a diversity signal path) that corresponds to a same carrier frequency of the first signal enables a common local oscillator (LO) signal to be used in the mixer circuit 488 for down-conversion of the first signal and the second signal.

Each of the other receiver blocks 354-358 may have a similar configuration as the first receiver block 352 and may be configurable to process different pairs of signals (e.g., a primary signal and a diversity signal corresponding to a particular carrier). To illustrate, the receiver block 354 has the input 372 coupled to the output 362 of the first cascaded switch 290 and an input 472 coupled to an output 462 of the second cascaded switch 293. The input 372 is coupled to an LNA 481 of the second plurality of LNAs 260 and the input 472 is coupled to an LNA 485 of the fourth plurality of LNAs 261. The receiver block 356 has the input 373 coupled to the output 363 of the first cascaded switch 290 and an input 473 coupled to an output 463 of the second cascaded switch 293. The input 373 is coupled to an LNA 482 of the second plurality of LNAs 260 and the input 473 is coupled to an LNA 486 of the fourth plurality of LNAs 261. The receiver block 358 has the input 374 coupled to the output 364 of the first cascaded switch 290 and an input 474 coupled to an output 464 of the second cascaded switch 293. The input 374 is coupled to an LNA 483 of the second plurality of LNAs 260 and the input 474 is coupled to an LNA 487 of the fourth plurality of LNAs 261.

The first plurality of LNAs 298 may include narrow band LNAs coupled to the antenna 408 via a band-dependent duplexer, and the receiver blocks 352-358 may include broad band LNAs (e.g., the LNAs 480, 482) that are capable of processing all carriers within a duplexer. The broad band LNAs in the receiver blocks 352-358 enable processing of intra non-contiguous CA while avoiding the complicated routing associated with conventional architectures. For example, the broad band LNAs of the second plurality of LNAs 260 may cover all desired LTE bands (e.g., 600 MHz~6 GHz). As a result, PCB routing complexity may be greatly simplified as compared to conventional architectures.

The cascaded switch 290 is configured to couple a plurality of LNA outputs of the first plurality of LNAs 298 to a plurality of the receiver blocks 352-358. To illustrate, the cascaded switch 290 may be fully configurable via control signals to route any output of the first plurality of LNAs 298 to any selected receiver block 352-358. For example, the data processor/controller 280 of FIG. 2 may assign each receiver block 352-358 to a distinct carrier of a selected downlink carrier aggregation and may generate one or more control signals (e.g., indicating a LO signal to be used) that causes each of the receiver blocks 352-358 to be configured to perform processing of signals corresponding to the receiver block's assigned carrier. The processor/controller 280 of FIG. 2 may also generate one or more control signals that cause the cascaded switches 290, 293 to be configured to route signals corresponding to the particular carriers to the respective receiver blocks 352-358, as described in further detail with respect to FIG. 6 and FIG. 7.

The cascaded switch 290 enables a broadband receive-side architecture for a transceiver (e.g., the transceiver 450) to process multi-carriers within a duplexer bandwidth using a single down-converter chain at each receiver block (e.g., the mixing circuit 488 and filters 489-490 of the receiver block 352). As a result, transceiver complexity may be simplified with reduced routing that enables reduced capacitive coupling between signal lines. In addition, a number of mixer circuits and filters may be reduced as compared to conventional transceiver architectures that include dedicated mixers and filters for each supported carrier, which may provide an improved key performance indicator. The receiver architecture including broad band LNAs in the receiver blocks 352-358 provides a scalable design that allows expansion to support higher downlink capability by supporting additional receiver blocks.

As a result of the cascaded switching architecture illustrated in FIG. 4, routing complexity between the pluralities of LNAs 298 and 299 and the downmixing circuitry in the transceiver 450 may be significantly reduced as compared to a routing arrangement that restricts specific LNAs of the first plurality of LNAs 298 and the third plurality of LNAs 299 to be coupled to specific narrowband LNAs in the transceiver 450 and to specific downmixing circuits. The cascaded switching architecture may reduce inter-CA coupling and other non-ideal effects and may also reduce cost and area requirements of RF front-end circuitry and transceiver circuitry.

FIG. 5 illustrates another exemplary embodiment 500 of components that may be included in the wireless device 110 of FIG. 1, including an exemplary embodiment of the cascaded switch 290 and the cascaded switch 293 of FIG. 4. The first plurality of switches 332 of the cascaded switch 290 is in the first LNA module 492 and is coupled via PCB routing to the second plurality of switches 334 that is in the transceiver 450. The second cascaded switch 293 includes a first tier of switches in the second LNA module 494 that is coupled via PCB routing to a second tier of switches that is in the transceiver 450.

Although the exemplary embodiment 500 is illustrated as having PCB routing that includes more lines than illustrated in FIG. 4, the PCB routing in the exemplary embodiment 500 may be less complex than the PCB routing in FIG. 4. For example, the PCB routing of FIG. 5 is illustrated without any lines crossing each other, while the PCB routing of FIG. 4 includes crossed lines. Reducing PCB routing complexity may reduce cost and may improve signal quality by reducing parasitic capacitance caused by crossed lines.

FIG. 6 shows another example 600 of components of the transceiver 220. The first plurality of LNAs 298 is illustrated as including LNAs dedicated to particular sub-bands of a low-band frequency band ("LB"), a middle-band frequency band ("MB"), a high-band frequency band ("HB"), and an ultra-high/LTE-U frequency band ("UH/LTEU"). The first plurality of switches 332 includes a LB switch 602 that has multiple inputs coupled to the LB LNAs and a single output 611 (e.g., a single-pole, 4-throw (SP4T) switch). A MB switch 604 has six inputs and two outputs 612, 613 (e.g., a double-pole, 6-throw switch). A HB switch 606 has four inputs and two outputs 614, 615 (e.g., a double-pole, 4-throw switch). A UH/LTEU switch 608 has two inputs and a single output 616 (e.g., a single-pole, double-throw switch). The second plurality of switches 334 includes six inputs 621-626 and four outputs 361-364 (e.g., a 4-pole, 6-throw switch). The second plurality of switches 334 is illustrated as including 24 single-pole, single-throw switches that are configurable to couple each particular output 361-364 of the second plurality of switches 334 to any of the six inputs 621-626 of the second plurality of switches 334.

The switching elements of the first plurality of switches 332 are responsive to one or more first control signals 630 to selectively route outputs of selected LNAs to respective outputs of the first plurality of switches 332. The switching elements of the second plurality of switches 334 are responsive to one or more second control signals 632 to selectively route inputs of the second plurality of switches 334 to respective outputs 361-364 of the second plurality of switches 334 (that may be coupled to respective receiver blocks 352-358). The control signals 630, 632 may be received from a control circuit, such as the data processor/controller 280 of FIG. 2.

The number of inputs and outputs of the first plurality of switches 332 and the number of inputs and outputs of the second plurality of switches 334 may vary depending on the number of CA signals to be supported and the possible combinations of CA bands. For example, if a CA combination could include two non-contiguous sub-bands in the LB, the LB switch 602 may include two outputs instead of one output. As another example, if more than four CA concurrent signals are to be supported, the second plurality of switches 334 may include more than four outputs (and the transceiver 450 of FIG. 4 may have more than four receiver blocks). Although an exemplary arrangement of switching elements is illustrated in the first plurality of switches 332 and the second plurality of switches 334, in other implementations other arrangements of switching elements may be used. For example, although a single multi-throw switch is illustrated for each of the low band, middle band, high-band, and ultra-high/LTEU bands, in other implementations multiple multi-throw switches may be used for one or more of the low band, middle band, high-band, and ultra-high/LTEU bands, or a multi-throw switch may span two or more of the low band, middle band, high-band, and ultra-high/LTEU bands, or a combination thereof.

Figure 7:
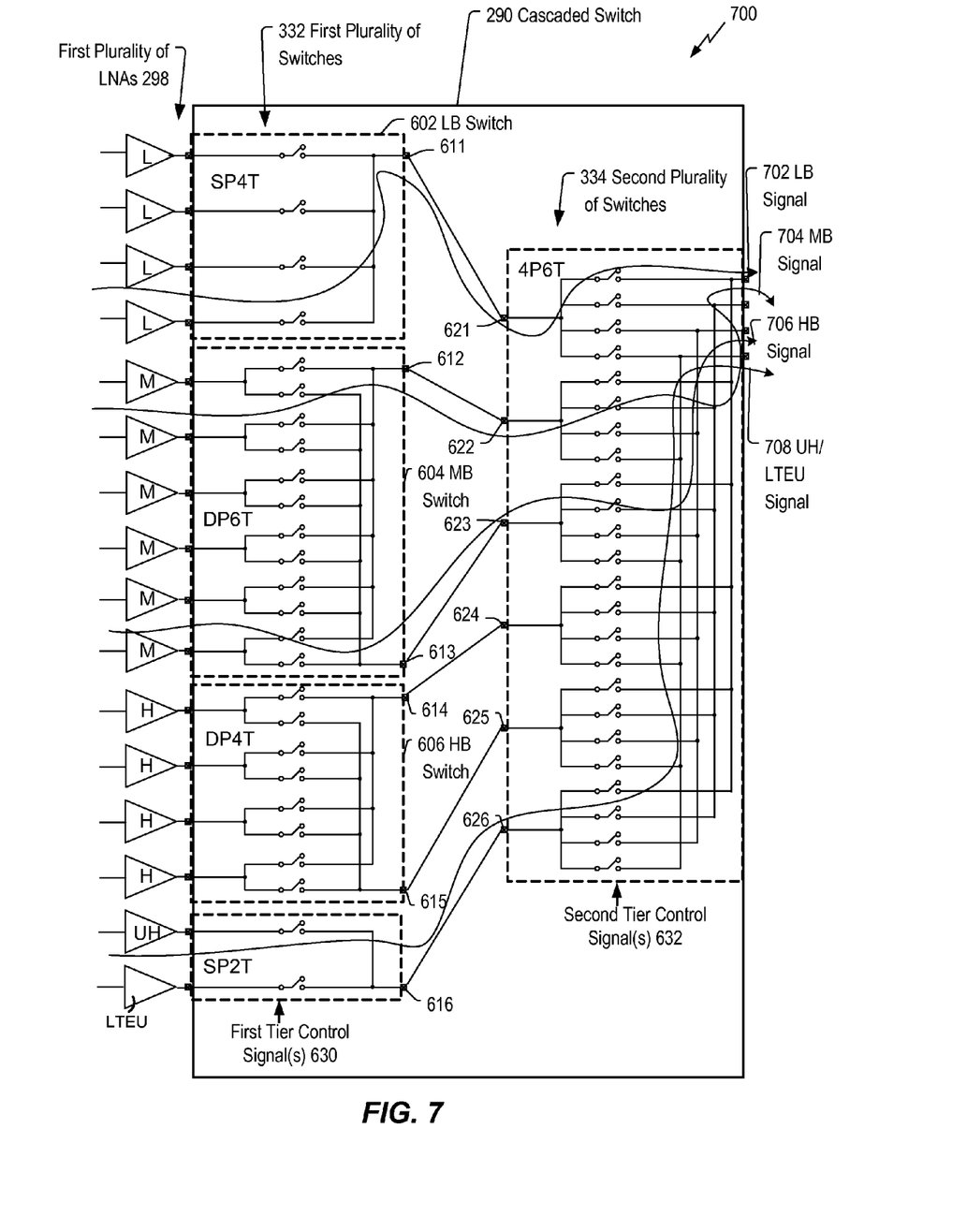
FIG. 7 shows a diagram of an exemplary embodiment of operation of the cascaded switch of FIG. 6.

FIG. 7 depicts an example 700 where the cascaded switch 290 of FIG. 6 is configured to couple LNA outputs of the first plurality of LNAs 298 to the receiver blocks 352-358 based on bandwidth via PCB routing. As illustrated, the first plurality of switches 332 and the second plurality of switches 334 are configured so that a LB signal 702 is provided via a first output of the second plurality of switches 334 to the first receiver block 352, a MB signal 704 is provided via a second output of the second plurality of switches 334 to the second receiver block 354, a HB signal 706 is provided via a third output of the second plurality of switches 334 to the third receiver block 356, and a UH/LTEU signal 708 is provided via a fourth output of the second plurality of switches 334 to the fourth receiver block 358. It should be appreciated that other configurations are possible that provide different bands to different receiver blocks based on the particular CA combination to be supported.

Figure 8:
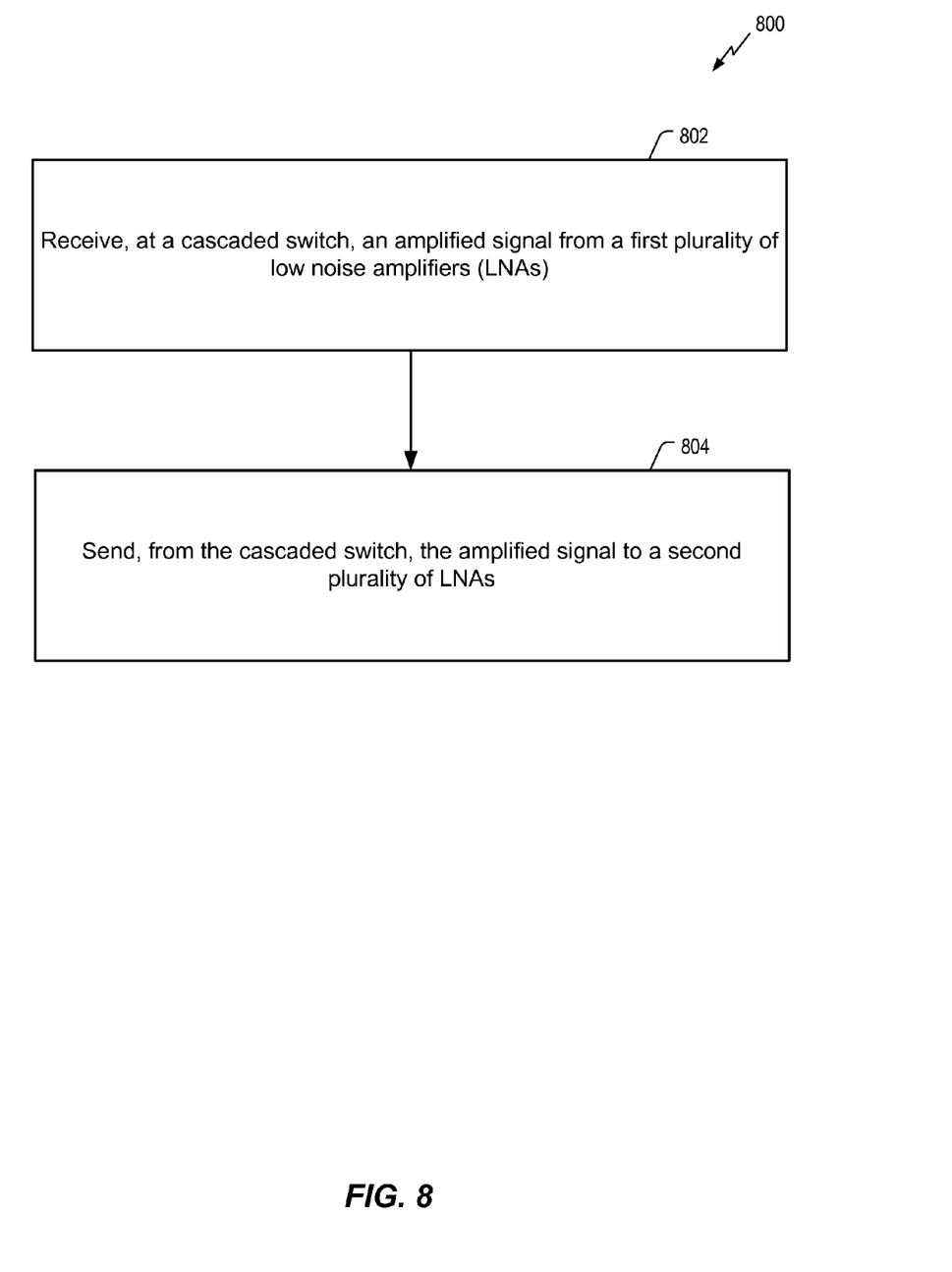
FIG. 8 illustrates a flowchart of a method of operation of a transceiver that includes a cascaded switch.

An exemplary method 800 of that may be performed in the wireless device 110 of FIG. 1 is shown in FIG. 8. The method 800 may be performed during operation of a transceiver, such as the transceiver 220 of FIG. 2, and may include receiving, at a cascaded switch, an amplified signal from a first plurality of low noise amplifiers (LNAs), at 802. For example, one or more LNAs of the first plurality of LNAs 298 may receive an input signal via the antenna interface signal 224 of FIG. 2 and generate an amplified signal. The cascaded switch 290 may receive the amplified signal from the first plurality of LNAs 298.

The amplified signal is sent from the cascaded switch to a second plurality of LNAs, at 804. For example, the cascaded switch 290 may route the amplified signal to the second plurality of LNAs 260 of FIGS. 2-3. To illustrate, the cascaded switch may couple a plurality of outputs of LNAs of the first plurality of LNAs to a plurality of receiver blocks that include the second plurality of LNAs. For example, the cascaded switch 290 of FIG. 3 may selectively couple outputs of LNAs of the first plurality of LNAs 298 to LNAs of the second plurality of LNAs 260 in the receiver blocks 352-358.

The cascaded switch enables routing complexity between the first plurality of LNAs and receiver circuitry to be reduced as compared to a routing arrangement that restricts specific LNAs to be coupled to specific narrowband LNAs and downmixing circuits in receiver circuits. The cascaded switch may reduce inter-CA coupling and other non-ideal effects and may also reduce cost and area requirements of RF front-end circuitry and transceiver circuitry.

In conjunction with the described embodiments, an apparatus may include means for routing first signals from first means for amplifying to generate first routed signals. The means for routing the first signal may include a first plurality of means for switching. For example, the means for routing the means for routing first signals may include the first plurality of switches 332 of FIGS. 3-7, one or more other devices, circuits, or any combination thereof.

The apparatus may include means for routing the first routed signals to second means for amplifying. The means for routing the first routed signals may include a second plurality of means for switching. For example, the means for routing the first routed signals may include the second plurality of switches 334 of FIGS. 3-7, one or more other devices, circuits, or any combination thereof.

The first means for amplifying may include one or more LNAs of the first plurality of LNAs 298 of FIG. 2-7, one or more LNAs of the third plurality of LNAs 299 of FIG. 2 or FIGS. 4-5, one or more other devices, circuits, or any combination thereof.

The second means for amplifying may include one or more of the LNAs of the second plurality of LNAs 260 of FIGS. 2-3, one or more LNAs of the fourth plurality of LNAs 261 of FIG. 2, one or more of the LNAs 480-487 of FIGS. 4-5, one or more other devices, circuits, or any combination thereof.

The first means for amplifying may include means for amplifying a narrow-band signal. For example, the means for generating the first amplifier output signals may include a narrow-band LNA.

The second means for amplifying may include means for amplifying a wide-band signal. For example, the means for generating the second amplifier output signals may include a wide-band LNA.

The apparatus may include means for routing second signals from third means for amplifying to generate second routed signals. For example, the means for routing the second signals may include a first plurality of switches in the cascaded switch 293 of FIG. 2 or FIGS. 4-5, one or more other devices, circuits, or any combination thereof.

The apparatus may include means for routing the second routed signals to a fourth means for amplifying. For example, the means for routing the second routed signals may include a second plurality of switches in the cascaded switch 293 of FIG. 2 or FIGS. 4-5, one or more other devices, circuits, or any combination thereof.

The third means for amplifying may include one or more LNAs of the third plurality of LNAs 299 of FIG. 2 or FIGS. 4-5, one or more other devices, circuits, or any combination thereof.

The fourth means for amplifying may include one or more of the LNAs of the second plurality of LNAs 260 of FIGS. 2-3, one or more LNAs of the fourth plurality of LNAs 261 of FIG. 2, one or more of the LNAs 480-487 of FIGS. 4-5, one or more other devices, circuits, or any combination thereof.

The apparatus may include means for radio-frequency signal processing first output signals of the second means for amplifying. The means for radio-frequency signal processing the first output signals may include one of more of the receive circuits 242 of FIG. 2, one or more of the receiver blocks 352-358 of FIGS. 3-5, the mixer circuitry 488 of FIGS. 4-5, one or both of the filters 489-490 of FIGS. 4-5, one or both of the ADCs 491-492 of FIGS. 4-5, one or more other devices, circuits, or any combination thereof.

The apparatus may include means for radio-frequency signal processing second output signals of the fourth means for amplifying. The means for radio-frequency signal processing the second output signals may include one of more of the receive circuits 242 of FIG. 2, one or more of the receiver blocks 352-358 of FIGS. 3-5, the mixer circuitry 488 of FIGS. 4-5, one or both of the filters 489-490 of FIGS. 4-5, one or both of the ADCs 491-492 of FIGS. 4-5, one or more other devices, circuits, or any combination thereof.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
    a first plurality of low noise amplifiers (LNAs);
    a cascaded switch configured to route outputs of the first plurality of LNAs to a second plurality of LNAs;
    a third plurality of LNAs; and
    a second cascaded switch configured to route outputs of the third plurality of LNAs to a fourth plurality of LNAs.

2. The apparatus of claim 1, the cascaded switch comprising:
    a first plurality of switches that includes first switches having inputs coupled to the first plurality of LNAs; and
    a second plurality of switches that includes second switches having inputs coupled to outputs of the first plurality of switches.

3. The apparatus of claim 2, wherein outputs of the second plurality of switches are coupled to inputs of the second plurality of LNAs.

4. The apparatus of claim 1, wherein the first plurality of LNAs includes narrow-band LNAs, and wherein the second plurality of LNAs includes wide-band LNAs.

5. The apparatus of claim 1, wherein the cascaded switch is configured to route the outputs of the first plurality of LNAs via printed circuit board routing to the second plurality of LNAs.

6. The apparatus of claim 1, wherein the first plurality of LNAs includes a first number of LNAs, wherein the second plurality of LNAs includes a second number of LNAs, and wherein the first number is greater than the second number.

7. The apparatus of claim 1, wherein the first plurality of LNAs is coupled to a first antenna, and wherein the third plurality of LNAs is coupled to a second antenna.

8. The apparatus of claim 7, further comprising a receiver that includes a first input coupled to an output of the cascaded switch and that includes a second input coupled to an output of the second cascaded switch.

9. The apparatus of claim 1, wherein the cascaded switch is configured to couple a plurality of the outputs of the first plurality of LNAs to LNAs of the second plurality of LNAs based on bandwidth and via printed circuit board routing.

10. An apparatus comprising:
means for routing first signals from a first plurality of low noise amplifiers (LNAs) to generate first routed signals;
means for routing the first routed signals to a second plurality of LNAs;
means for routing second signals from a third plurality of LNAs to generate second routed signals; and
means for routing the second routed signals to a fourth plurality of LNAs.

11. The apparatus of claim 10, the first plurality of LNAs comprising narrow-band LNAs.

12. The apparatus of claim 10, the second plurality of LNAs comprising wide-band LNAs.

13. The apparatus of claim 10, further comprising means for signal processing first output signals of the second plurality of LNAs.

14. The apparatus of claim 13, wherein the means for signal processing comprises means for mixing the first output signals based on a first local oscillator (LO) signal.

15. The apparatus of claim 14, the means for routing the first signals comprising a first plurality of means for switching, and the means for routing the first routed signals comprising a second plurality of means for switching.

* * * * *